United States Patent
Chou et al.

(10) Patent No.: US 11,757,356 B2
(45) Date of Patent: Sep. 12, 2023

(54) CHARGE PUMP SYSTEM WITH LOW RIPPLE OUTPUT VOLTAGE

(71) Applicant: Taiwan Semiconductor Manufacturing Company, Ltd., Hsinchu (TW)

(72) Inventors: Chung-Cheng Chou, Hsin-Chu (TW); Tien-Yen Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/737,207

(22) Filed: May 5, 2022

(65) Prior Publication Data
US 2022/0263409 A1    Aug. 18, 2022

Related U.S. Application Data

(62) Division of application No. 16/657,221, filed on Oct. 18, 2019, now Pat. No. 11,336,174.

(51) Int. Cl.
*H02M 3/07* (2006.01)
*G11C 13/00* (2006.01)
*G11C 5/14* (2006.01)

(52) U.S. Cl.
CPC ............. *H02M 3/07* (2013.01); *G11C 5/145* (2013.01); *G11C 13/0038* (2013.01)

(58) Field of Classification Search
CPC ...... H02M 3/07; H02M 1/0022; H02M 3/073; H02M 3/077; G11C 5/145; G11C 13/0038; G11C 29/028; G11C 29/021
See application file for complete search history.

(56) References Cited

U.S. PATENT DOCUMENTS

| | | |
|---|---|---|
| 6,278,317 B1 | 8/2001 | Hsu et al. |
| 6,486,728 B2 | 11/2002 | Kleveland |
| 6,853,567 B2 | 2/2005 | Kwon |
| 7,176,747 B2 | 2/2007 | Lee et al. |
| 7,224,207 B2 | 5/2007 | Chou et al. |
| 8,290,171 B1 | 10/2012 | Helfrich et al. |
| 2005/0195019 A1 | 9/2005 | Okamoto |
| 2010/0302835 A1 | 12/2010 | Mihnea et al. |
| 2015/0063042 A1 | 3/2015 | Plavec et al. |

FOREIGN PATENT DOCUMENTS

| | | |
|---|---|---|
| CN | 107592011 A | 1/2018 |
| CN | 108320762 A | 7/2018 |
| EP | 1 176 603 A1 | 1/2002 |
| JP | 2003242790 A | 8/2003 |
| JP | 2005251347 A | 9/2005 |
| KR | 10-2014-0042184 A | 4/2014 |

OTHER PUBLICATIONS

Chinese Office Action for Application No. 202010498676.3 dated Jul. 13, 2023.

*Primary Examiner* — Jerome Leboeuf
(74) *Attorney, Agent, or Firm* — Merchant & Gould P.C.

(57) ABSTRACT

A system includes a charge pump system having a plurality of enable signal input terminals and an output terminal, the charge pump system configured to provide an output voltage at the output terminal; and a detection circuit connected to the enable terminals and the output terminal of the charge pump system, the detection circuit configured to compare the charge pump system output voltage to a plurality of predefined input detection voltage levels, and to selectively output a plurality of enable signals to the charge pump system enable signal input terminals in response to the comparison.

18 Claims, 7 Drawing Sheets

CHARGE PUMP SYSTEM WITH LOW RIPPLE OUTPUT VOLTAGE

CROSS-REFERENCE TO RELATED APPLICATION

This application is a divisional of application Ser. No. 16/657,221, filed Oct. 18, 2019, the disclosure of which is hereby incorporated by reference in its entirety.

BACKGROUND

Charge pump circuits are generally used for generating higher voltages from low voltage inputs. It is typically used for providing a steady level of output voltage. The provision of these higher voltages is critical in many low voltage applications such as providing the bias voltage for a memory cells such as a RRAM cell.

A conventional charge pump system used to provide bias voltages for a memory cell may comprise a charge pump to generate the higher voltage followed by a filter, typically a RC filter, and a low dropout regulator circuit to filter out the noise and provide a stable, low ripple voltage to the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
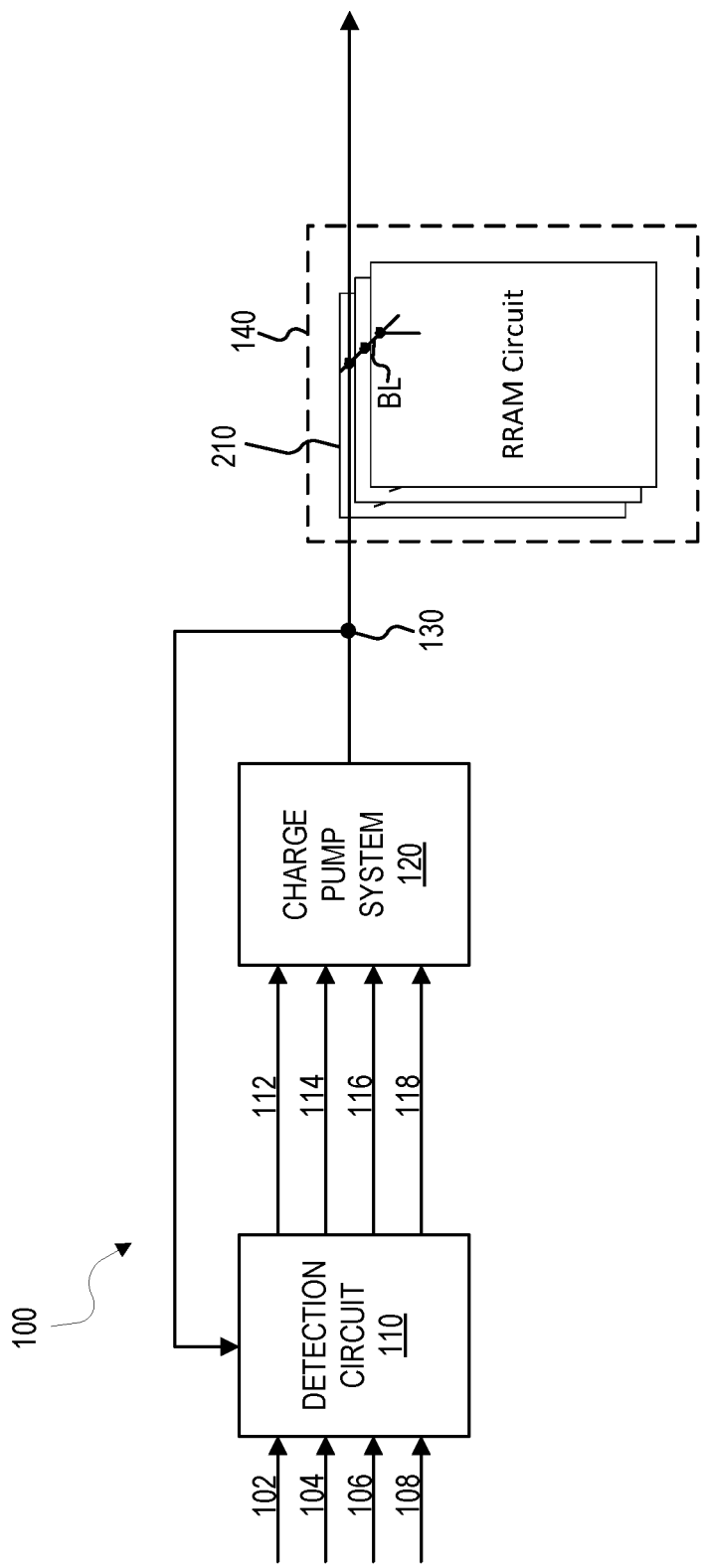
FIG. 1 is a block diagram illustrating an example of a charge pump system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some memory cells, such as RRAM cells, the word line bias voltage may need to be boosted to a higher level than the voltage provided by the power supply voltage. Typically, a charge pump circuit is used to supply the higher voltage as necessitated by the memory cell to function within the proper operating range. In such cases, the charge pump circuit is designed to operate under the highest possible current load conditions. However, when the current load is low, the output voltage of such charge pumps may include higher ripple amplitudes than desired. Therefore, under such conditions, circuits to reduce ripple amplitude of the charge pump output voltage may be employed.

Typically, memory cells, during write operations, may need a biasing voltage that may be larger than the supply voltage to operate within the proper range. In such cases, a charge pump is used to boost the voltage level higher. However the output voltage generated by the charge pump may not stable enough for biasing memory cells operations. Therefore, an RC filter and an LDO are sometimes used to smooth out the output of the charge pump before being used to bias the one or more memory cell write voltages. The RC Filter is designed to filter out the ripples from the output signal of the charge pump. However, an RC filter may occupy substantial area, induce extra IR drop and increase the current load.

FIG. 1 illustrates an example system 100 in accordance with disclosed embodiments that provides a low ripple voltage signal. Voltage ripple is the residual periodic variation of DC voltage when it is derived from an AC power supply. Voltage ripple is measured as peak-to-peak voltage amplitudes. In some examples, the system 100 can reduce the output ripple voltage of the charge pump system 120 such that the peak to peak ripple voltage measures +/−20 mV. In other examples, the output ripple voltage may measure +/−10 mV or +/−5 mV. The system 100 includes a detection circuit 110 and a charge pump system 120. The charge pump system 120 receives a plurality of enable signals 112, 114, 116, 118 as inputs to control the operation of the charge pump system. In one example, the plurality of enable signals includes four enable signals, 112, 114, 116, 118. However, any number of enable signals may be generated by the detection circuit 110. The number of enable signals may be based on the voltage boost capacity of the one or more charge pumps used within the charge pump system. Examples of disclosed charge pump systems are described below in relation to FIG. 4 and FIG. 5.

Figure 4:
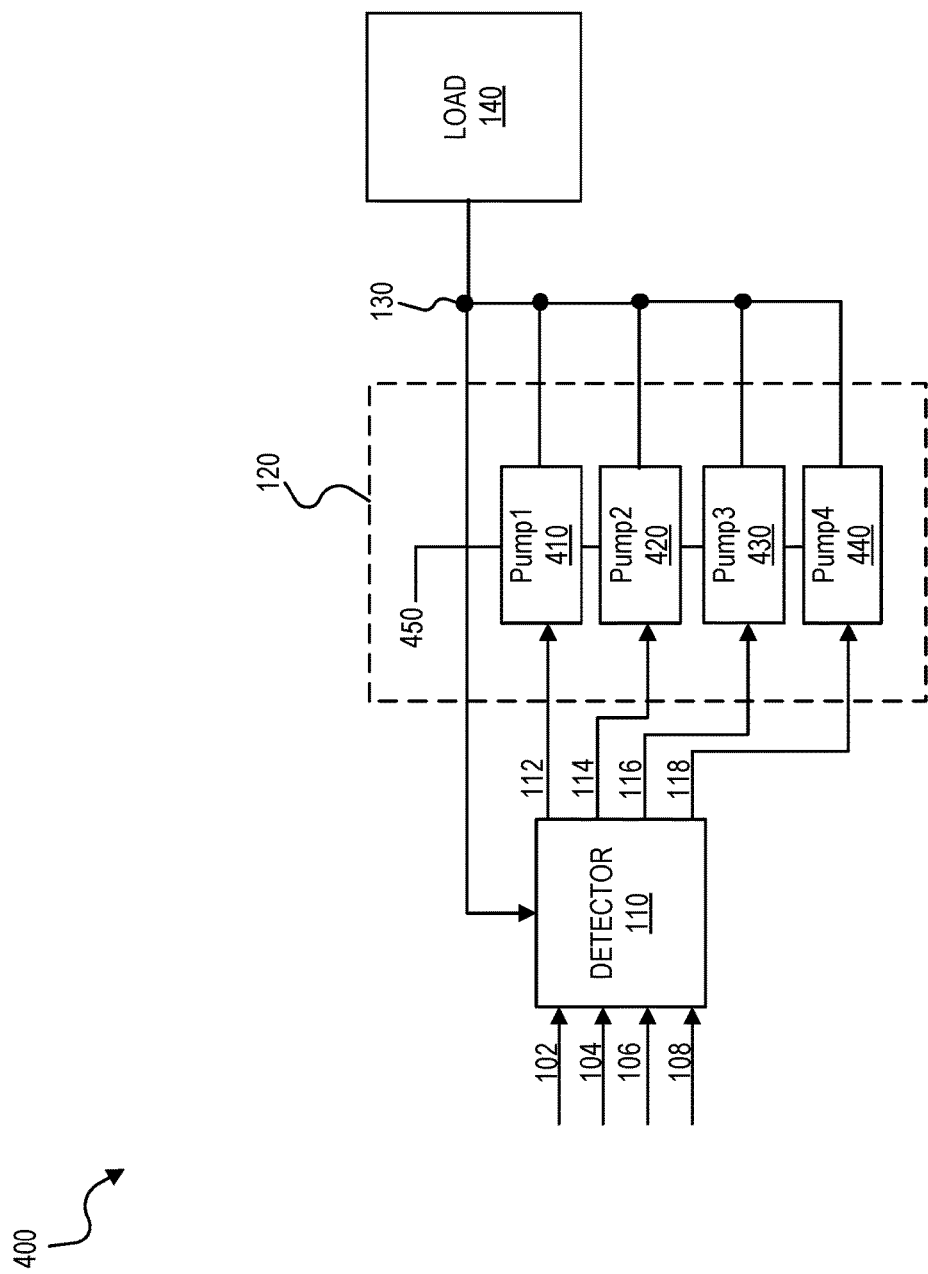
FIG. 4 is a circuit diagram illustrating an example of the charge pump of FIG. 1 in accordance with some embodiments.
Figure 5:
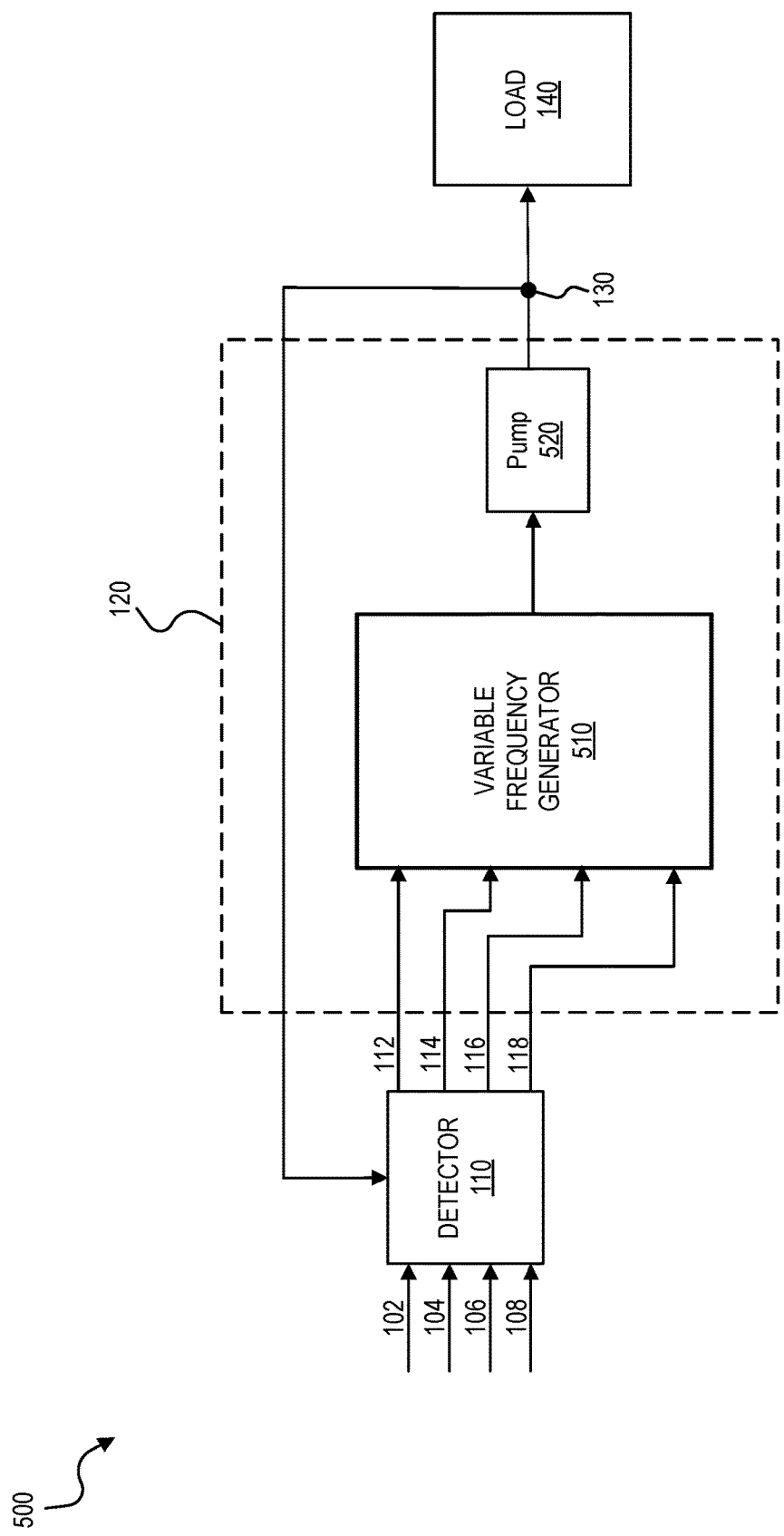
FIG. 5 a circuit diagram illustrating another example of the charge pump of FIG. 1 in accordance with some embodiments.

The charge pump system 120 is configured to generate a boosted level of output voltage at a node 130. The charge pump output voltage at node 130 of the charge pump system 120 can then be fed into a load 140. In the illustrated example, the load 140 is a circuit that uses the boosted low ripple voltage for its operation, such as a memory circuit 210, which typically uses a stable, low ripple voltage signal for its write bias voltage during write operations. The charge pump output voltage at node 130 is also used as an input signal for the detection circuit 110 as part of a feedback loop. FIG. 4 and FIG. 5 show two different embodiments of the charge pump system connected to the detection circuit 110 that can be used to generate the low ripple output signal as used by a load 140.

In some examples, the detection circuit 110 is configured to monitor the charge pump output voltage at node 130. The detection circuit 110 includes a plurality of input detection voltage levels 102, 104, 106, 108, and the charge pump output voltage from node 130 as inputs. The detection circuit 110 outputs a plurality of enable signals, 112, 114, 116, 118. Although four input detection voltage levels 102, 104, 106, 108 and four enable signals 112, 114, 116, 118 are shown in the example illustration of the system 100, it is understood that the number of input detection voltage levels and enable signals are variable and other numbers of input detection voltage levels and enable signals are within the scope of the present disclosure. The plurality of enable signals, 112-118 are then included as inputs to the charge pump system 120. The plurality of enable signals are used to control the operation of the one or more charge pumps that are part of the charge pump system 120. The detection circuit 110 is described in greater detail in relation to FIG. 3.

Figure 2:
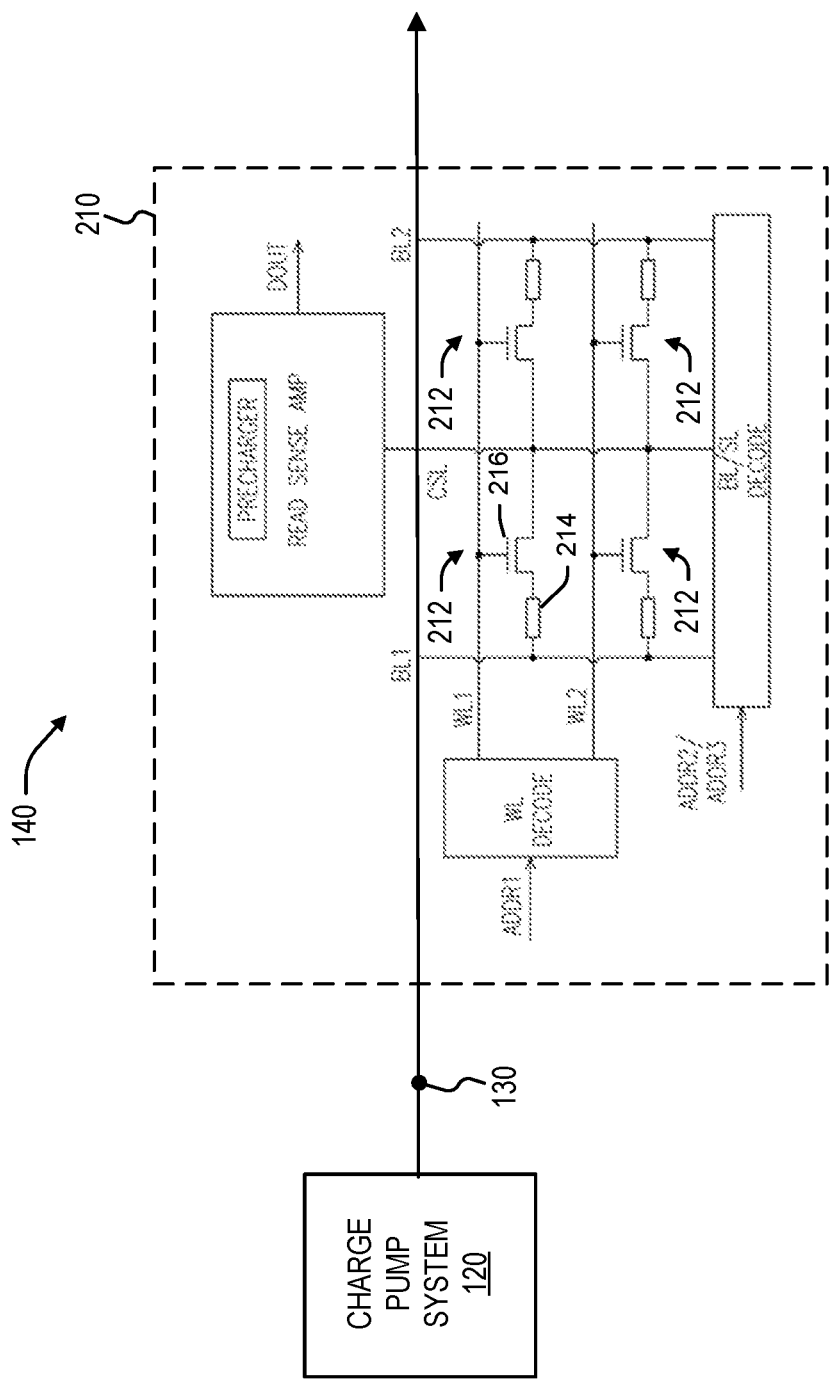
FIG. 2 is a block diagram illustrating an example of a resistive random access memory (RRAM) circuit in accordance with some embodiments.

FIG. 2 illustrates an embodiment of the load 140 that includes the memory circuit 210. Memory devices are used to store information in semiconductor devices and systems. The illustrated memory circuit 210 includes a plurality of Resistive Random Access Memory (RRAM) cells 212 arranged in an array of rows and columns. RRAM memory cells are non-volatile memory cells that store information based on changes in electric resistance. In general, each RRAM cell 212 includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

For discussion purposes, FIG. 2 shows four RRAM memory cells 212. However, a typical RRAM memory array would include many more RRAM cells. The RRAM cells 212 are arranged within the RRAM array in rows and/or columns. RRAM cells 212 within a row of the RRAM array are operably coupled to a word line WL1 or WL2, respectively, while RRAM cells 212 within a column of the RRAM array are operably coupled to a bit line BL1 or BL2 and a common source line CSL. The plurality of RRAM cells are respectively associated with an address defined by an intersection of a word line WL1 or WL2 and a bit line BL1 or BL2.

Each of the RRAM cells 212 includes an RRAM resistive element 214 and an access transistor 216. The RRAM resistive element 214 has a resistive state that is switchable between a low resistive state and a high resistive state. The resistive states are indicative of a data value (e.g., a "1" or "0") stored within the RRAM resistive element 214. The RRAM resistive element 214 has a first terminal coupled to one of the bit lines BL1 or BL2 and a second terminal coupled to the access transistor 216. The access transistor has a gate coupled to one of the word lines WL1 or WL2, a source coupled to the common source line CSL and a drain coupled to the second terminal of the RRAM resistive element 214. By activating the word line WL1 or WL2, the access transistor 214 is turned on, allowing for the common source line CSL to be coupled to the second terminal of the RRAM resistive element 214.

The RRAM array is configured to read data from and/or write data to the plurality of RRAM cells 212. A word line signal (e.g., a current and/or voltage) is applied to one of the word lines WL1-WL2 based upon a first address ADDR1 received by a word line decoder, a bit line signal is applied to one of the plurality of bit lines BL1-BL2 based upon a second address ADDR2 by a bit line decode. In some examples, and a common source line signal is applied to the common source line CSL based on the second address ADDR2, and in other examples the CSL signal is applied to the common source line CSL based upon a third address ADDR3.

By selectively applying signals to the word lines WL1-WL2, the bit lines BL1-BL2, and the common source line CSL, forming, set, reset, and read operations may be performed on selected ones of the plurality of RRAM cells 212. For example, to read data from a particular RRAM cell 212, a word line signal (e.g., voltage) is applied to the word line WL1, a bit line signal (e.g., voltage) is applied to the bit line BL1, and a source line signal (e.g., voltage) is applied to the common source line CSL. The applied signals cause a read sense amplifier to receive a signal (e.g., voltage) having a value that is dependent upon a data state of the RRAM cell 212. The sense amplifier is configured to sense this signal and to determine the data state of the selected RRAM cell based on the signal (e.g., by comparing a received voltage to a reference voltage).

Figure 3:
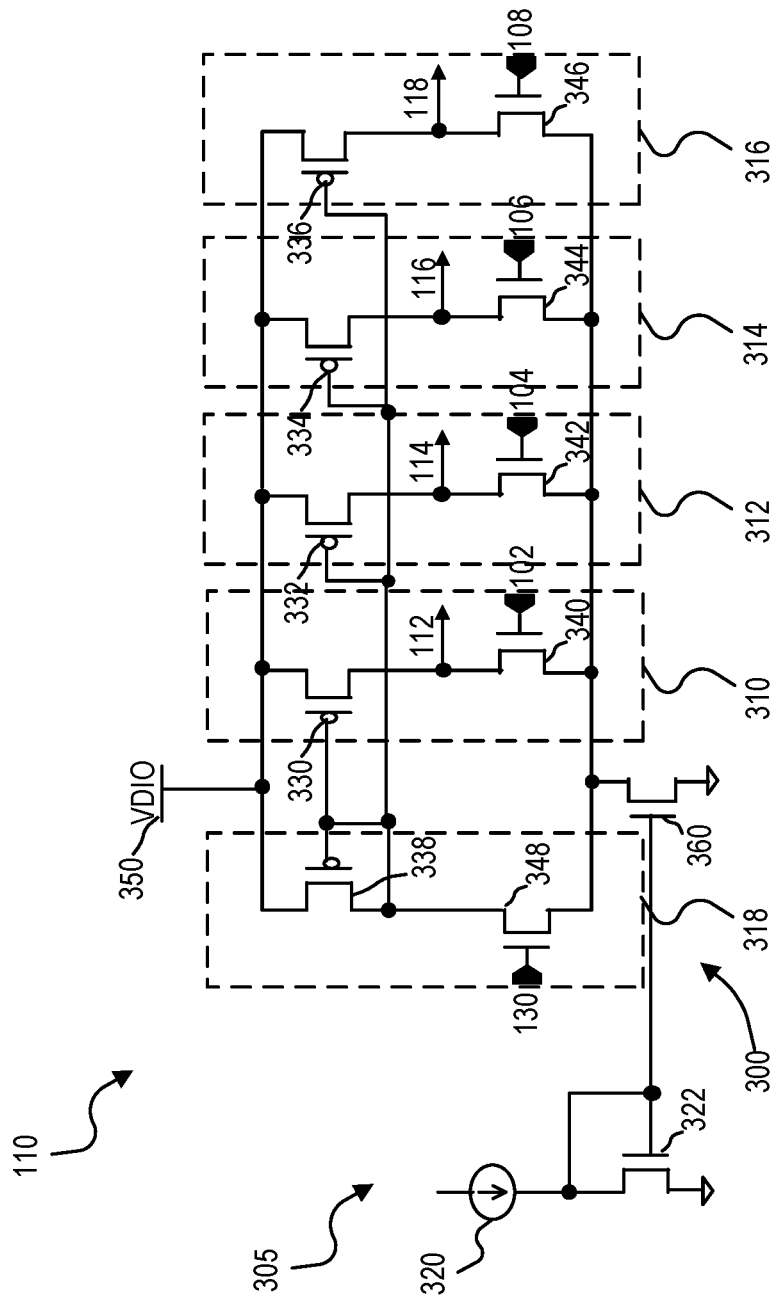
FIG. 3 is a circuit diagram illustrating an example of the detection circuit of FIG. 1 in accordance with some embodiments.

FIG. 3 illustrates an embodiment of the detection circuit 110. In one example, the detection circuit is implemented with a voltage comparator that is configured to include a plurality of input voltage level detection circuit branches. The detection circuit 110 includes a current bias circuit 305 that supplies a shared current to the plurality of input voltage level detection circuit branches 310, 312, 314, 316. While an embodiment including four input voltage level detection circuit branches 310, 312, 314, 316 is illustrated in FIG. 3, it is understood that the detection circuit 110 may be designed to include more or fewer input voltage level detection circuit branches. Each input voltage level detection circuit branch is associated with an input detection voltage level and an enable output signal, for example input detection voltage level 102 and enable output signal 112 in the case of the input voltage level detection circuit branch 310 shown in FIG. 3.

The current bias circuit 305 includes a current source 320 that is connected to the drain terminal of an NMOS transistor 322. The source of the NMOS transistor is connected to ground. The gate terminal of the NMOS transistor 322 is tied to the drain terminal of the NMOS transistor 322, which is connected to the current source 320. The gate terminal of the NMOS transistor 322 is also tied to the gate terminal of another NMOS transistor 360. The current source 320, the NMOS transistor 322 and the NMOS transistor 360 are arranged in a current mirror configuration.

In the illustrated example, the input detection voltage levels 102, 104, 106, 108 are pre-determined voltage values that are dependent on the voltage requirements of the load 140 connected to the output of the charge pump system and the voltage boost capabilities of the one or more chare pumps included in the charge pump system 120. In one example, in order to maintain a low ripple charge pump output voltage at 2.5V, the four input detection voltage levels 102, 104, 106, 108 are set at 2.68V, 2.62V, 2.56V and 2.5V. The input detection voltage levels are pre-determined to ensure that the charge pump output voltage at node 130 stays adequately higher than the current load requirements of the load 140.

Each of the input voltage level detection circuit branches 310, 312, 313 and 316 comprises a PMOS transistor and an NMOS transistor. For example, the input voltage level detection circuit branch 310 comprises PMOS transistor 330 and NMOS transistor 332. The source terminal of the PMOS transistors 330, 332, 334, 336 of the respective input voltage level detection circuit branches 310, 312, 314, 316 are each connected to a rail voltage terminal 350 configured to receive a supply voltage VDIO. The drain terminal of each PMOS transistor 330, 332, 334, 336 is tied to the drain terminal of its respective NMOS transistor 340, 342, 344, 346 and is also connected to respective enable signals 112, 114, 116, 118. The source terminals of each of the NMOS transistors 340, 342, 344, 346 are connected to the drain terminal of the NMOS transistor 360. The source terminal of the NMOS transistor 360 is connected to ground.

The gate terminals of the PMOS transistors 330, 332, 334, 336 are tied together and are also connected to the gate terminal and drain terminal of a PMOS transistor 338 that is part of a charge pump output voltage level detection circuit 318. The gate terminals of the NMOS transistors 340, 342, 344, 346 are configured to receive the respective input detection voltage levels 102, 104, 106, 108. The gate terminal of the NMOS 348 of the charge pump voltage level detection circuit 318 is connected to the charge pump output voltage at node 130. The drain terminal of the NMOS transistor 348 is tied to the drain terminal of the PMOS transistor 338 and the source terminal of the NMOS transistor is tied to the source terminal of the NMOS transistors 340, 342, 346, 348 and connected to the drain terminal of the NMOS transistor 360.

The input voltage level detection circuit branches 310, 312, 314, 316 are in a current mirror configuration with the charge pump output voltage level detection circuit 318. The current mirror configuration provides a trans-impedance element such that the input voltage level detection circuit branches 310-316 have a voltage output 112-118.

In one example, the PMOS transistors 330, 332, 334, 336 of each of the plurality of input voltage level detection circuit branches 310, 312, 314, 316 are designed to have the same size as the PMOS transistor 338, and the NMOS transistors 340, 342, 344, 346 of each of the plurality of input voltage level detection circuit branches 310, 312, 314, 316 are designed to have the same size as the NMOS transistor 348. The size of such MOS devices is defined, for example, by the width and length parameters of the MOS devices. For instance, a wider device allows more current flow. The width and length parameters may be selected such that the MOS devices have sufficient drive strength to supply the desired current and leakage levels. In addition to the matching sizes of the transistors, the layout of the PMOS transistors are all configured to match and the layout of the NMOS transistors are all configured to match.

In the illustrated example, the detection circuit 110 is implemented using a voltage comparator circuit 300. The charge pump output voltage at node 130 is tied to the gate terminal of the NMOS device 348 of the charge pump voltage level detection circuit 318 as part of a feedback mechanism. The NMOS device's 348 operation is thus controlled by charge pump output voltage at node 130. The NMOS transistor 360 is configured to be in a current mirror configuration with the NMOS transistor 322. Accordingly, the current flowing through NMOS transistor 322 matches the current flowing through NMOS transistor 360. Thus the current flowing though each branch 310-318 totals to match the current source 320.

The detection circuit 110 is configured to compare the voltage at node 130 to each of the plurality of input detection voltage levels 102, 104, 106, 108. For example, if the charge pump operation cannot supply the necessary current load, the charge pump output voltage at node 130 will descend. Upon comparing the charge pump output voltage at node 130 with the first detection voltage level 102, if the voltage level 102 is lower than the charge pump output voltage at node 130, the corresponding enable signal 112 goes high. The same process happens with the other input voltage level detection circuit branches 312, 314, and 316 as well. As the load 140 draws a higher current load, more enable signals 112-118 are pulled high to subsequently turn on more charge pump circuits.

FIG. 4 illustrates an example low ripple voltage signal system 400 in accordance with one embodiment of the charge pump system 120. The low ripple voltage signal system 400 comprises the detection circuit 110, the charge pump system 120 and the load 140. The illustrated embodiment of the charge pump system 120 includes a plurality of charge pumps 410, 420, 430, 440. Although the embodiment of the charge pump system 120 from FIG. 4 shows four charge pumps 410, 420, 430, 440, it is understood that the charge pump system 120 may include more or fewer charge pumps. Each charge pump receives a respective one of the enable signals 112, 114, 116, 118, and a fixed frequency clock signal 450 as inputs. The outputs of the plurality of charge pumps are tied together and serve as the input to the load 140.

The charge pumps 410, 420, 430, 440 operate based on the state of the enable signals 112, 114, 116, 118 from the detection circuit 110. For example, if the enable signal 112 received by the charge pump 410 is high, the charge pump 410 will generate a boosted level of charge pump system output voltage at node 130. The voltage level at node 130 can be adjusted by turning one or more of the charge pumps 410, 420, 430, 440 on or off. The adjustment to correct any fluctuations or ripples in the charge pump system output voltage is done automatically using the detection circuit 110 coupled with the feedback from the charge pump system output voltage at node 130. The detection circuit 110 monitors the charge pump system voltage level at the node 130 and controls the charge pumps 410, 420, 430, 440 accordingly. If the charge pump system output voltage level at node 130 drops, the multiple voltage detection circuits sense the drop and triggers the relevant input voltage level detection circuit branches to turn the corresponding enable signal high. The enable signals each control a charge pump that subsequently turns on to output a boosted voltage. The number of charge pumps that are turned on and the operating capacity of each charge pump is directly proportional to the amount of voltage boost received by the charge pump system output voltage level at node 130. For example, if each charge pump has the operating capacity to produce a voltage boost of 0.06V, and the charge pump system output voltage drops by 0.18V, then three of the charge pumps will be turned on automatically to boost the charge pump system output voltage by 0.18V. Thus, any drops in the charge pump system output voltage is corrected by the boost in voltage provided by turning on the appropriate charge pumps within the charge pump system 120.

For example, looking at the overall charge pump system 120, when a charge pump is turned on, the charge pump output voltage at node 130 gets a boost in voltage. When the charge pump output voltage at node 130 hits the second detection voltage level 104, the enable signal 114 goes high and enables a second charge pump to turn on, which in turn boosts the charge pump output voltage at node 130 even more. If the current load is larger than the operating capacity of the charge pump, the output voltage will keep descending and trigger more charge pumps until the charge pump system operates to surpass the current load. Since operation of the charge pump system is always adequately higher than the current load, this can effectively suppress over shoots of the charge pump.

FIG. 5 illustrates another example low ripple voltage signal system 500 in accordance with another embodiment of the charge pump system 120. The low ripple voltage signal system 500 comprises the detection circuit 110, an alternative embodiment of the charge pump system 120 and the load 140. The embodiment of the charge pump system 120 shown in FIG. 5 includes a variable frequency generator 510 and a charge pump 520. One example of the variable frequency generator 510 may be implemented using a tunable ring oscillator. An example implementation of the tunable ring oscillator is described in relation to FIG. 6, which is discussed further below. The charge pump 520 is configured to generate a boosted level of output voltage at the node 130. This output signal at the node 130 is also used as an input signal for the detection circuit 110 as part of a feedback loop as discussed above. The detection circuit 110 shown in FIG. 5 is arranged to monitor the output voltage level of the charge pump 520 at the node 130. The output of the detection circuit 110 is a set of enable signals 112, 114, 116, 118 for the input of the variable frequency generator 510. The frequency of the variable frequency generator 510 can be adjusted according to the plurality of enable signals 112, 114, 116, 118 that are provided by the detection circuit 110. This also means that the current load provided as the input of the charge pump 520 can be adjusted according to the output voltage level of the charge pump 520 at the node 130, thus stabilizing the output voltage level of the charge pump 520.

For example, as the output voltage of the charge pump 520 at node 130 drops, the detection circuits senses the drop and triggers the relevant input voltage level detection circuit branches to turn the corresponding enable signal high. The number of enabled level detection circuits is translated to the digital signal used to control the frequency selection of the variable frequency generator's 510 output clock signal. In one example, the variable frequency generator may comprise a tunable ring oscillator circuit. A lower charge pump output voltage at node 130 may start a faster ring oscillator to speed up the charge pumping operation and induce a larger output current to increase the dropping voltage level, thus regulating the voltage drop at the charge pump output.

Figure 6:
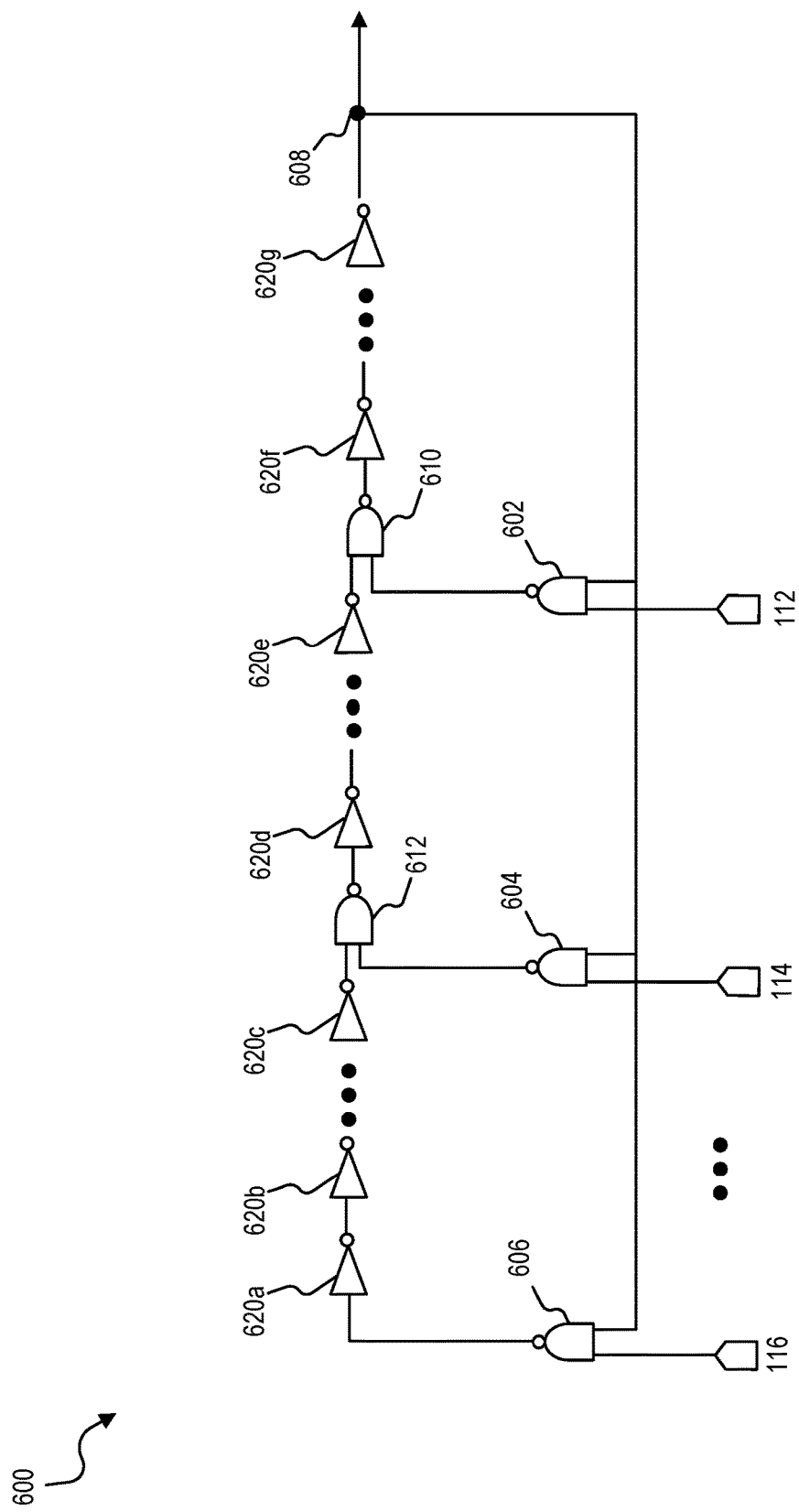
FIG. 6 is a circuit diagram illustrating an example of a tunable ring oscillator in accordance with some embodiments.

FIG. 6 illustrates an example of a tunable ring oscillator 600 that may be implemented within the charge pump system 120 shown in FIG. 1. The tunable ring oscillator 600 is a loop that comprises a plurality of NAND gates 610, 612 and inverters 620*a*-620*g* (collectively inverters 620). The oscillator 600 is configured to provide a frequency output to the charge pump 520 at a certain frequency. The ring oscillator 600 further includes a plurality of input NAND gates 602, 604, 606.

In this example, three different output frequencies may be provided. However, it is understood that more or less number of frequencies can be made available by connecting more number NAND gates in addition to NAND gates 602, 604 and 606 and routing more enable signals to the NAND gate inputs. NAND gates 602, 604, and 606 are implemented to control the frequency selection of the tunable ring oscillator 600 based on the enable signals 112, 114, 116 from the detection circuit 110. Each of the NAND gates 602, 604, 606 has one input connected to receive a corresponding one of the enable signals 112, 114, 116 from the detection circuit 110 shown in FIG. 3. The NAND gates 602, 604, 606 further have a second input connected to receive the oscillator output 608 as a feedback signal. For the NAND gates 602 and 604, and the outputs are tied respectively to an input of the NAND gates 610 and 612. The NAND gates 610 and 612 are used to determine how many sets of inverters 620 are connected to the loop.

In the tunable ring oscillator 600, the frequency can be adjusted according to the one or more enable signals 112, 114, 116 from the detection circuit 110 shown in FIG. 3. The inverters 620 function as delay elements, and the tunable ring oscillator 600 operates by using the time delays implemented by the inverters 620 to change the frequency of the output signal 608. If a higher number of inverters 620 are connected, the oscillator 600 provides a lower frequency output signal at node 608, while if a lower number of inverters 620 are connected, the oscillator 600 provides a higher frequency output signal at node 608. With different combinations of enable signals controlling the NAND gates 602, 604, 606, 610, 612 the number of inverters 620 that are part of the ring can be adjusted and thus the frequency of the tunable ring oscillator 600 can be adjusted. If a higher number of enable signals are turned on, then the oscillator output signal has a lower frequency. If fewer enable signals are turned on, then the oscillator output signal has a higher frequency.

Figure 7:
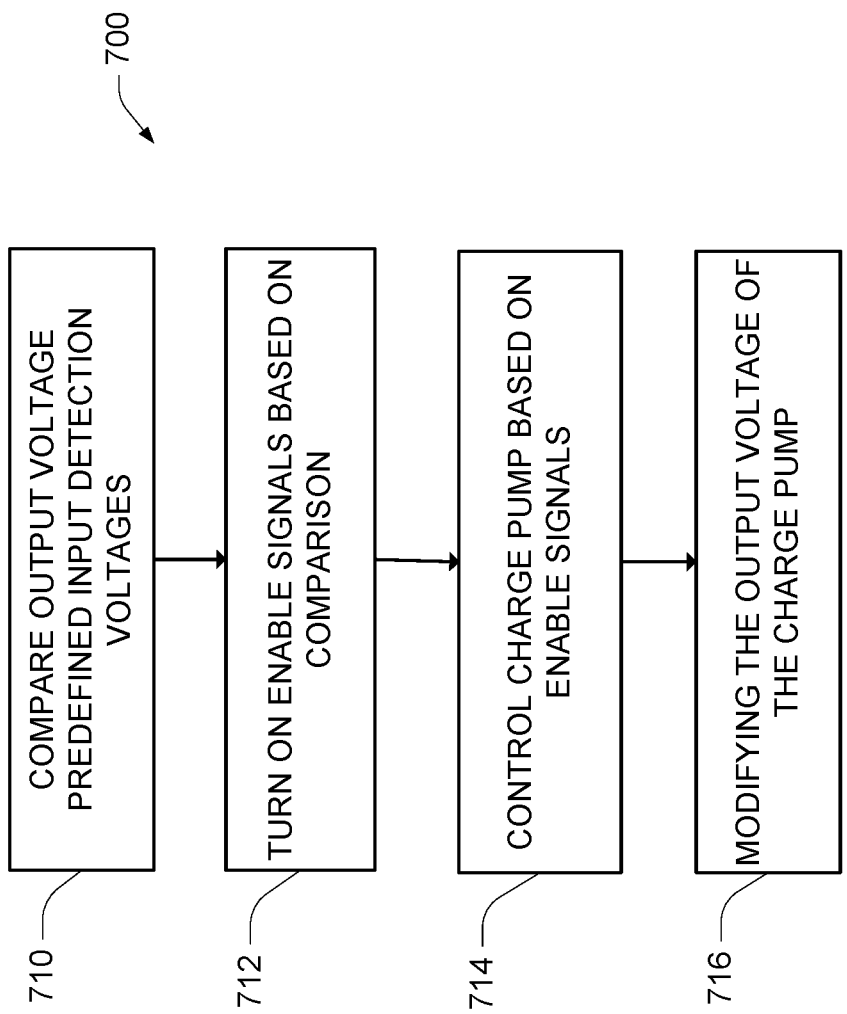
FIG. 7 is a flow diagram illustrating an example of a method in accordance with some embodiments.

FIG. 7 illustrates a method 700 in accordance with disclosed embodiments. At step 710, an output voltage at an output node 130 of a charge pump 120 is compared to a plurality of predefined input detection voltage levels at input terminals 102-104. At step 712, one or more of a plurality of enable signals at enable terminals 112-118 are turned on based on the comparison of step 710. Based on the enable signals that are turned on, the charge pump 120 is controlled at step 714 to modify the output voltage of the charge pump as shown in step 716. For example, a clock signal frequency may be selected from a plurality of predetermined frequencies by the variable frequency generator 510 shown in FIG. 5, and the selected clock frequency is output to the charge pump 120. In other examples, one or more of a plurality of charge pumps 410 may be activated based on the enable signals as shown in FIG. 4.

Thus, disclosed embodiments provide a charge pump system that minimizes the ripple amplitude of a charge pump circuit output voltage, without increasing the circuit area or the current load. Some disclosed embodiments include a detection circuit and feedback mechanism to sense a drop in voltage automatically enable a charge pump system to compensate for the drop in voltage, thus reducing ripple amplitude in the voltage signal.

In accordance with some embodiments, a system that reduces ripple of a charge pump system output voltage is disclosed. The system comprises charge pump system having a plurality of enable signal input terminals and an output terminal, the charge pump system configured to provide an output voltage at the output terminal; and a detection circuit connected to the enable terminals and the output terminal of the charge pump system, the detection circuit configured to compare the charge pump system output voltage to a plurality of predefined input detection voltage levels, and to selectively output a plurality of enable signals to the charge pump system enable signal input terminals in response to the comparison.

In accordance with further embodiments, a memory system that includes a low ripple input voltage is disclosed. The memory cell system comprises: an array of memory cells; a plurality of bit lines connected to the array of memory cells; a plurality of charge pumps, each having an enable signal input terminal and an output terminal coupled to the plurality of bit lines; and a detection circuit connected to the enable terminals and the output terminal of the charge pump, the detection circuit configured to compare the charge pump output voltage to a plurality of predefined reference voltage levels, and to selectively output a plurality of respective enable signals to the charge pump enable signal input terminals in response to the comparison.

In accordance with other embodiments, a method for generating a low ripple charge pump system output voltage is disclosed. The method comprises: comparing an output voltage of a charge pump to a plurality of predefined input detection voltage levels; based on the comparison, causing one or more of a plurality of enable signals to turn on; based on the enable signals that are turned on, selecting a clock signal frequency from a plurality of predetermined frequencies; outputting the selected clock frequency to the charge pump; and modifying the output voltage of the charge pump based on the selected clock frequency.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
a variable frequency generator having a plurality of enable signal input terminals that receive a plurality of enable signals and an output terminal;
a charge pump device with a charge pump input terminal connected to the output terminal of the variable frequency generator and a charge pump output terminal, wherein the charge pump device is configured to receive the selected clock frequency from the variable frequency generator at the charge pump input terminal and generate a charge pump output voltage at the charge pump output terminal based on the selected clock frequency;
a detection circuit connected to the enable signal input terminals of the variable frequency generator and the charge pump output terminal, the detection circuit configured to compare the charge pump output voltage to a plurality of predefined input detection voltage levels, and to selectively output the plurality of enable signals to the enable signal input terminals of the variable frequency generator in response to the comparison; and
wherein the detection circuit includes a plurality of input level detection circuit branches, wherein each input level detection circuit branch of the plurality of input level detection circuit branches includes a first PMOS transistor and a first NMOS transistor and wherein a source terminal of the first NMOS transistor is configured to connect to a drain terminal of a current mirror NMOS transistor that is part of a current mirror configuration.

2. The system of claim 1, wherein each branch of the plurality of input detection circuit branches is configured to compare the charge pump output voltage to a corresponding one of the plurality of predefined input detection voltage levels, and wherein each input level detection circuit branch is connected to a respective one of the enable signal input terminals.

3. The system of claim 2, wherein the detection circuit includes a bias current generator circuit configured to provide a bias current to each of the plurality of input level detection circuit branches.

4. The system of claim 2 wherein:
the source terminal of the first PMOS transistor is connected to a rail input voltage;
the gate terminal of the first PMOS transistor is connected to the drain of the first NMOS transistor whose gate is connected to the charge pump output terminal;
the drain terminal of the first PMOS transistor is connected to one of the plurality of enable signal input terminals and to the drain terminal of the first NMOS transistor; and
the gate terminal of the first NMOS transistor is connected to one of the plurality of predefined input detection voltage levels.

5. The system of claim 4, wherein the PMOS transistors of the each of the plurality of input level detection circuit branches have the same size, and wherein the NMOS transistors of the each of the plurality of input level detection circuit branches have the same size.

6. The system of claim 1, wherein the variable frequency generator includes a tunable ring oscillator circuit.

7. The system of claim 6, wherein the tunable ring oscillator circuit comprises a plurality of NAND gates and inverters connected in a loop.

8. The system of claim 1, wherein the variable frequency generator is configured to output a selected clock frequency based on a configuration of the enable signals.

9. The system of claim 1, further comprising:
an array of memory cells;
a plurality of bit lines connected to the memory cells;
wherein the output terminal of the charge pump system is coupled to the plurality of bit lines.

10. The system of claim 9, wherein the memory cells include resistive random access memory (RRAM) cells.

11. A memory system comprising:
an array of memory cells;
a plurality of bit lines connected to the array of memory cells;
a variable frequency generator having a plurality of enable signal input terminals that receive a plurality of enable signals and an output terminal;
a charge pump device with a charge pump input terminal connected to the output terminal of the variable frequency generator and a charge pump output terminal, wherein the charge pump output terminal is coupled to the plurality of bit lines and the charge pump device is configured to receive the selected clock frequency from the variable frequency generator at the charge pump input terminal and generate a charge pump output voltage at the charge pump output terminal based on the selected clock frequency;

a detection circuit connected to the enable signal input terminals of the variable frequency generator and the charge pump output terminal, the detection circuit configured to compare the charge pump output voltage to a plurality of predefined input detection voltage levels, and to selectively output the plurality of enable signals to the enable signal input terminals of the variable frequency generator in response to the comparison; and wherein the detection circuit includes a plurality of input level detection circuit branches, wherein each input level detection circuit branch of the plurality of input level detection circuit branches includes a first PMOS transistor and a first NMOS transistor and wherein a source terminal of the first NMOS transistor is configured to connect to a drain terminal of a current mirror NMOS transistor that is part of a current mirror configuration.

12. The memory system of claim 11, wherein each branch of the plurality of input detection circuit branches is configured to compare the charge pump output voltage to a corresponding one of the plurality of predefined input detection voltage levels, and wherein each input level detection circuit branch is connected to a respective one of the enable signal input terminals.

13. The memory system of claim 11 wherein:
the source terminal of the first PMOS transistor is connected to a rail input voltage;
the gate terminal of the first PMOS transistor is connected to the drain of the first NMOS transistor whose gate is connected to the charge pump output terminal;
the drain terminal of the first PMOS transistor is connected to one of the plurality of enable signal input terminals and to the drain terminal of the first NMOS transistor; and
the gate terminal of the first NMOS transistor is connected to one of the plurality of predefined input detection voltage levels.

14. The memory system of claim 13, wherein the PMOS transistors of each of the plurality of input level detection circuit branches have the same size, and wherein the NMOS transistors of each of the plurality of input level detection circuit branches have the same size.

15. The memory system of claim 12, wherein the variable frequency generator includes a tunable ring oscillator circuit.

16. A method, comprising:
comparing an output voltage of a charge pump device to a plurality of predefined input detection voltage levels using a detection circuit that includes a plurality of a plurality of input level detection circuit branches, wherein each input level detection circuit branch of the plurality of input level detection circuit branches includes a first PMOS transistor and a first NMOS transistor and wherein a source terminal of the first NMOS transistor is configured to connect to a drain terminal of a current mirror NMOS transistor that is part of a current mirror configuration;
based on the comparison, causing one or more of a plurality of enable signals to turn on;
based on the enable signals that are turned on, selecting a clock signal frequency from a plurality of predetermined frequencies;
outputting the selected clock signal frequency to the charge pump device; and
modifying the output voltage of the charge pump device based on the selected clock signal frequency.

17. The method of claim 16, wherein the clock signal frequency is selected using a tunable ring oscillator circuit.

18. The method of claim 16, wherein selecting a clock signal frequency that is higher in frequency than the current frequency increases the output voltage of the charge pump device and wherein selecting a clock signal frequency that is lower in frequency than the current frequency decreases the output voltage of the charge pump device.

* * * * *